(12) United States Patent
Aybay et al.

(10) Patent No.: US 7,826,222 B2
(45) Date of Patent: Nov. 2, 2010

(54) FRONT-TO-BACK COOLING SYSTEM FOR MODULAR SYSTEMS WITH ORTHOGONAL MIDPLANE CONFIGURATION

(75) Inventors: Gunes Aybay, Los Altos, CA (US); Jean-Marc Frailong, Los Altos, CA (US); Sindhu Pradeep, Los Altos Hills, CA (US); David J. Lima, Los Altos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 67 days.

(21) Appl. No.: 12/167,604

(22) Filed: Jul. 3, 2008

(65) Prior Publication Data

US 2010/0002382 A1    Jan. 7, 2010

(51) Int. Cl.
*H05K 7/20* (2006.01)
(52) U.S. Cl. .................................. 361/695; 361/694
(58) Field of Classification Search ........................ None
See application file for complete search history.

(56) References Cited

U.S. PATENT DOCUMENTS

| | | | | |
|---|---|---|---|---|
| 5,477,416 | A * | 12/1995 | Schkrohowsky et al. | 361/695 |
| 5,663,868 | A * | 9/1997 | Stalley | 361/695 |
| 5,912,801 | A * | 6/1999 | Roy et al. | 361/690 |
| 6,163,454 | A * | 12/2000 | Strickler | 361/695 |
| 6,449,150 | B1 * | 9/2002 | Boone | 361/694 |
| 6,768,640 | B2 * | 7/2004 | Doblar et al. | 361/695 |
| 7,154,748 | B2 * | 12/2006 | Yamada | 361/690 |
| 2005/0207134 | A1 * | 9/2005 | Belady et al. | 361/796 |

* cited by examiner

*Primary Examiner*—Gregory D Thompson
(74) *Attorney, Agent, or Firm*—Akin Gump Strauss Hauer & Feld; Sanford E. Warren, Jr.

(57) ABSTRACT

A front-to-back cooling system allows cooling of an apparatus containing two orthogonal sets of modules. Each set of modules is independently cooled. A vertical set of modules is cooled with vertical air flow across the modules that enters from a front of the apparatus and exhausts from a back of the apparatus. A horizontal set of modules is cooled with horizontal front-to-back air flow. When the horizontal set of modules is at the front of the apparatus, a plenum extending exterior to the vertical set of modules allows exhausting horizontally flowing air to the rear of the apparatus. When the horizontal set of modules is at the rear of the apparatus, a plenum extending exterior to the vertical set of modules allows moving air from the front of the apparatus to a chamber holding the horizontal modules.

7 Claims, 11 Drawing Sheets

REAR VIEW

Fig. 8  FRONT VIEW

FRONT-TO-BACK COOLING SYSTEM FOR MODULAR SYSTEMS WITH ORTHOGONAL MIDPLANE CONFIGURATION

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A COMPACT DISK APPENDIX

Not applicable.

TECHNICAL FIELD

The present invention relates to the field of cooling systems, and in particular to cooling of a modular system with orthogonal modules.

BACKGROUND ART

Systems that require very high bandwidth any-to-any connectivity among a set of modules typically use an orthogonal mid-plane configuration. In this configuration, a set of cards are plugged into the front side of the mid-plane in vertical configuration and another set of cards are plugged into the rear side of the mid-plane in horizontal configuration. This layout enables each front card to be directly connected to each rear card, and makes it possible to eliminate the use of PCB signal traces on the mid-plane to carry high speed signals.

However, the orthogonal configuration also creates a cooling challenge, especially in applications where front-to-back cooling is required. Vertical cards can be cooled using conventional cooling mechanisms with front air intake and rear air exhaust, but cooling the horizontal cards while maintaining overall front-to-back air flow is challenging.

If front-to-back cooling is not required, the horizontal card cage can be cooled using side-to-side air flow. However, many rack mount environments require front-to-back air cooling. One solution has been to divert air taken from a front intake to the back and run it up in a column next to the horizontal cards. Such a mechanism typically uses a set of fans or blowers to create the air pressure across the horizontal cards. However, the amount of air flow that is provided in such a system is typically limited due the number of turns in the air path. Also, the placement of one or two fan blades along the sides of the horizontal cards can severely limit the PCB area and panel surface that is available.

SUMMARY OF INVENTION

In one embodiment, a method of cooling an apparatus comprises: forming a plenum on a side of a first chamber of the apparatus, open to a front of the apparatus, partitioning the apparatus with an air-permeable barrier, forming a second chamber separated from the plenum and the first chamber by the air-permeable barrier, pulling air from the front of the apparatus via the plenum through the air-permeable barrier into the second chamber, and exhausting air from the second chamber to a rear of the apparatus.

In another embodiment, a method of cooling an apparatus comprises: cooling a first plurality of modules oriented in a first direction, comprising: pushing air from an edge of each of the first plurality of modules in the first direction, and pulling air from an opposite edge of each of the first plurality of modules in the first direction, and cooling a second plurality of modules oriented in a second direction, orthogonal to the first direction, comprising: moving air in the second direction across the second plurality of modules and through a plenum extending exterior to a first chamber containing the first plurality of modules, and exhausting air from the apparatus.

In yet another embodiment, a method of cooling an apparatus comprises: forming a plenum on a side of a first chamber containing a first plurality of modules, moving air from a front of the apparatus through the plenum into a second chamber containing a second plurality of modules, the second plurality of modules mounted orthogonal to the first plurality of modules, and exhausting air to a rear of the apparatus from the second chamber.

In yet another embodiment, a cooling system for an apparatus comprises: a first chamber, a plenum formed exterior to the first chamber and fluidly isolated from the first chamber, a second chamber in fluid communication with the plenum, a cooling system for the first chamber, comprising: a first fan, configured to push air across the first chamber, and a second fan, configured to pull air from the first chamber, and a cooling system for the second chamber, comprising: a third fan, configured to move air through the plenum into the second chamber.

In yet another embodiment, a method of cooling an apparatus comprises: forming a first plenum on a side of a first chamber containing a first plurality of modules, moving air from a front of the apparatus across a second plurality of modules, the second plurality of modules mounted orthogonal to the first plurality of modules in a second chamber, and exhausting air from the second plurality of modules through the first plenum to a rear of the apparatus.

BRIEF DESCRIPTION OF DRAWINGS

The accompanying drawings, which are incorporated in and constitute a part of this specification, illustrate an implementation of apparatus and methods consistent with the present invention and, together with the detailed description, serve to explain advantages and principles consistent with the invention. In the drawings.

DESCRIPTION OF EMBODIMENTS

Figure 1:
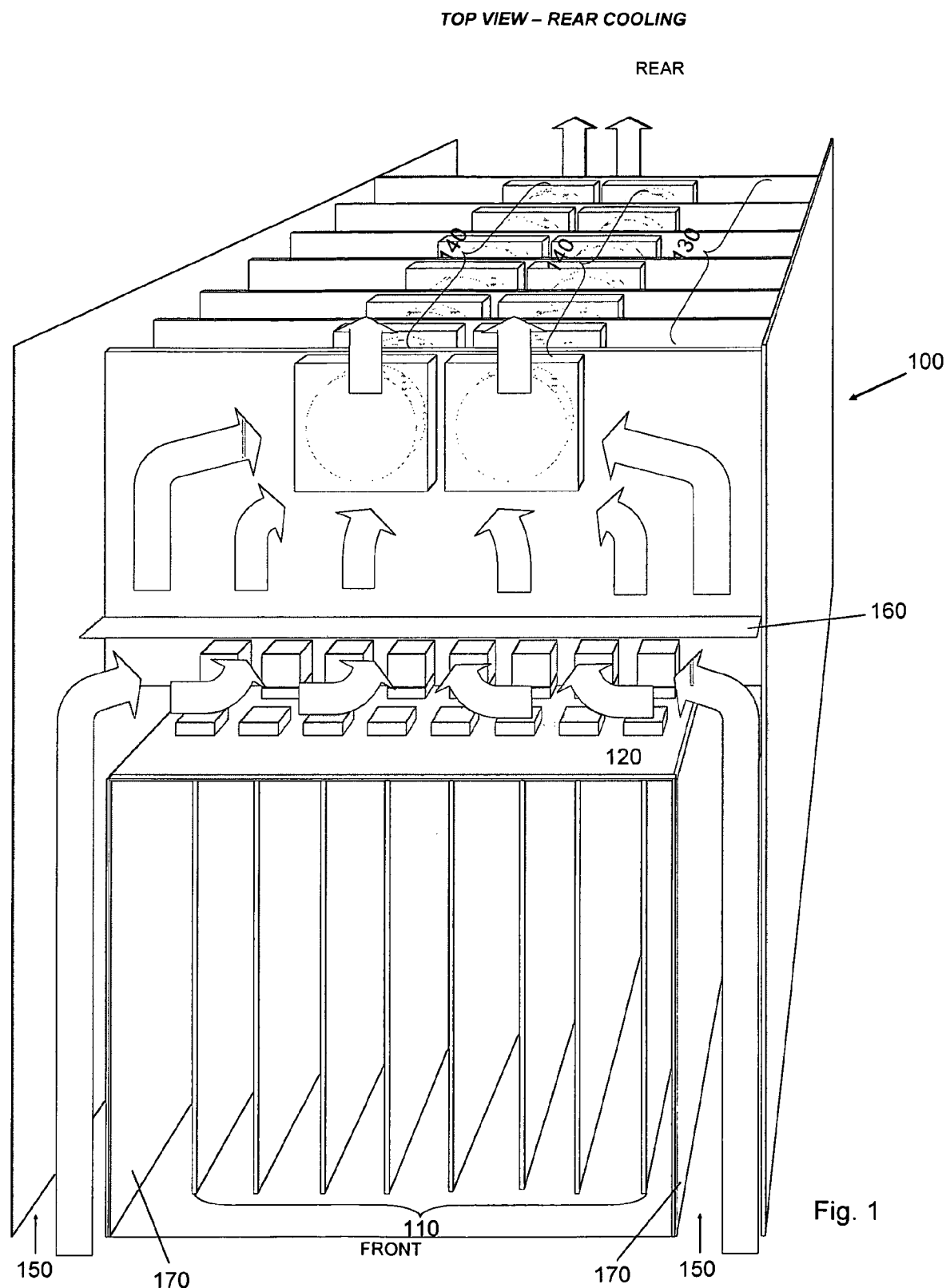
FIG. 1 is a top perspective view illustrating an apparatus with orthogonal modules according to one embodiment.

FIG. 1 is a top perspective view illustrating an apparatus 100 with orthogonal modules according to one embodiment.

The apparatus 100 can be, for example, an enterprise class router, and the modules are typically circuit boards. But the disclosed technique can be used in any apparatus with orthogonal modules. In this embodiment, the apparatus 100 contains a plurality of modules 110 oriented vertically in a front section of the apparatus 100 and a plurality of modules 130 oriented in a horizontal direction in a rear section of the apparatus 100. Modules 110 and 130 are cross-connected through a mid-plane 120. In this embodiment, the vertical modules 110 are enclosed by an enclosure 170 on either side forming a plenum 150 on either side of the vertical modules 110 extending from the front of the apparatus 100 past the mid-plane 120. An air-permeable barrier 160 is placed between each of the modules 130, forming a rear chamber of the apparatus 100. In some embodiments, barrier 160 is a perforated rippled material where the perforation pattern can be figured to create a pressure difference between the front section on one side of the barrier 160 and the rear section on the other side of the barrier 160. This pressure difference can achieve a more uniform air flow across more of the surface area of modules 130. As shown in FIG. 1, fans or blowers 140 are placed at a rear portion of the modules 130. The fans or blowers 140 pull air from the front of the apparatus 100 through the plenum 150 and through the barrier 160 across the modules 130 providing cooling to the modules 130. Heated air is then exhausted through openings on the rear of the apparatus 100 as described below. As shown in FIG. 1, in some embodiments, two blowers 140 are positioned centrally at the rear of each module 130. In other embodiments, a single fan or blower 140 could be used. Alternately, the fan or fans 140 could be positioned in other locations on the modules 130 as desirable for uniform air flow across the surface of the modules 130 or to provide higher air flow across portions of the surface area of the modules 130 that generate proportionally more heat than other portions of the modules 130.

Figure 2:
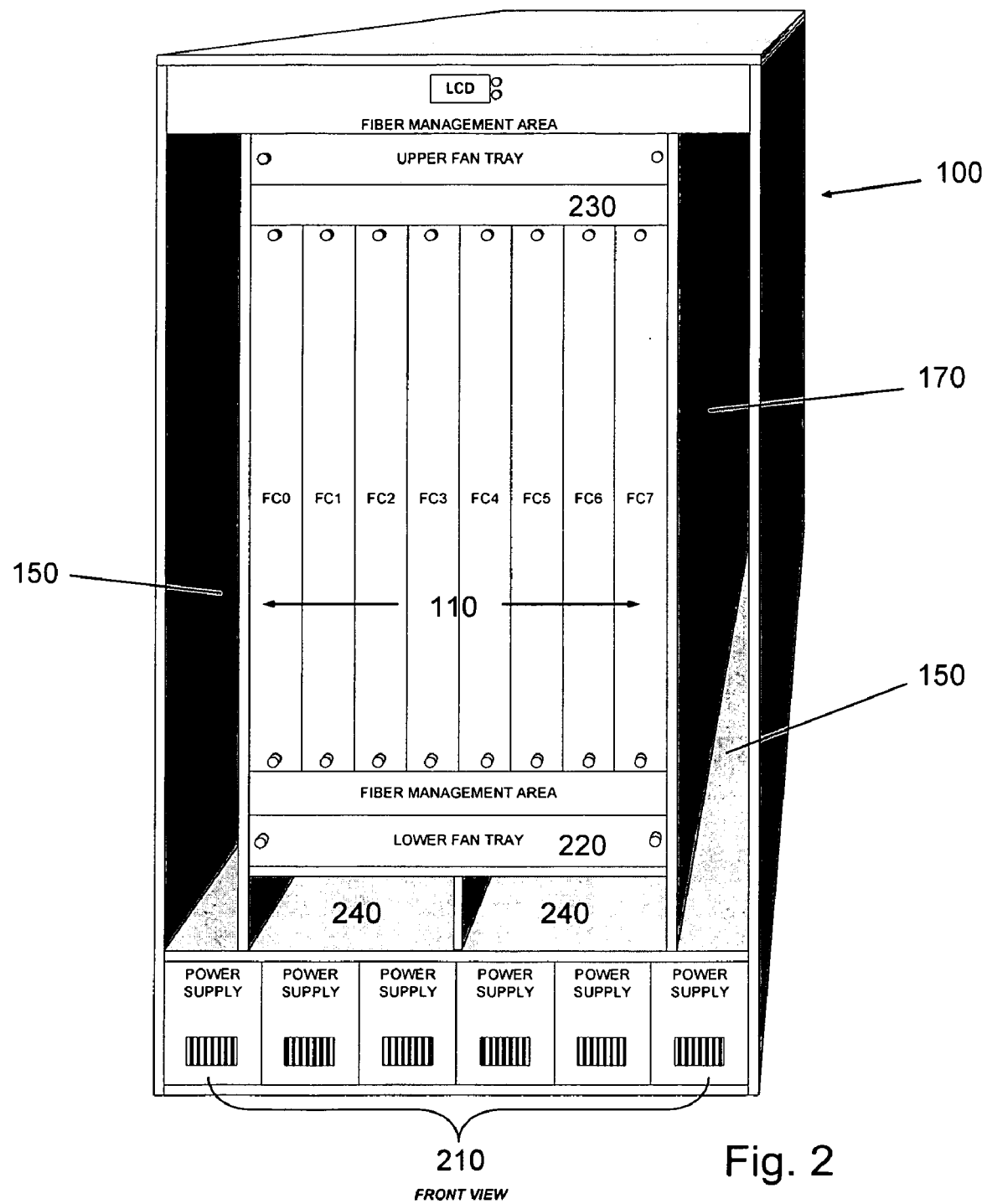
FIG. 2 is a rear perspective view of the apparatus of FIG. 1.

Turning to FIG. 2, a front view of the apparatus 100 shows the plenums 150 on either side of the enclosure 170 surrounding the vertically oriented modules 110. Additionally, FIG. 2 shows an independent cooling system for the modules 110. A plenum 240 is formed beneath the vertically oriented modules 110 and a lower fan tray 220 contains a plurality of fans that push air vertically across the surfaces of the modules 110 to provide cooling to the modules 110. An upper fan tray 230 contains a plurality of fans that pull heated air from the modules 110 and exhaust the heated air toward the rear of the apparatus 100 as described below. A plurality of power supplies 210 are shown in FIG. 2 at the bottom of the apparatus 100. In some embodiments, each of these power supply units provides its own front-to-back air cooling path from front openings or inlets in the power supply units 210.

Figure 3:
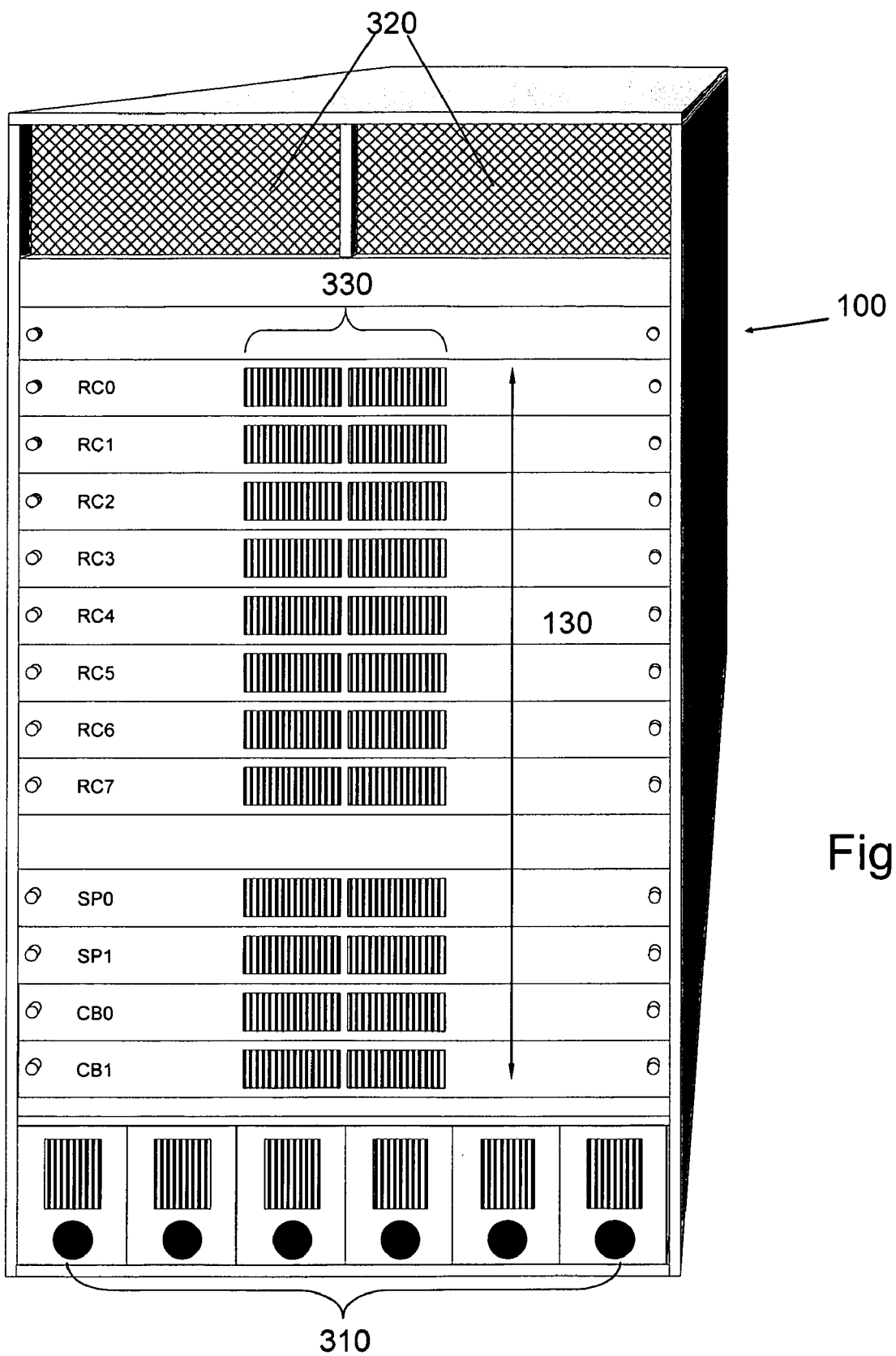
FIG. 3 is a front perspective view of the apparatus of FIG. 1.

Turning to FIG. 3, a rear view in perspective of the apparatus 100 illustrates the outlets where heated air is exhausted to the rear of the apparatus 100. A collection of power supply exhaust outlets 310 correspond to the power supply inlets 210 of FIG. 2. A pair of exhaust outlets 330 is also shown for each of the modules 130, corresponding to the two fans or blowers 140 illustrated in FIG. 1. Finally, outlets 320 provide exhaust outlets for heated air that have cooled the vertical modules 110 and is exhausted from the upper fan tray 230.

Figure 4:
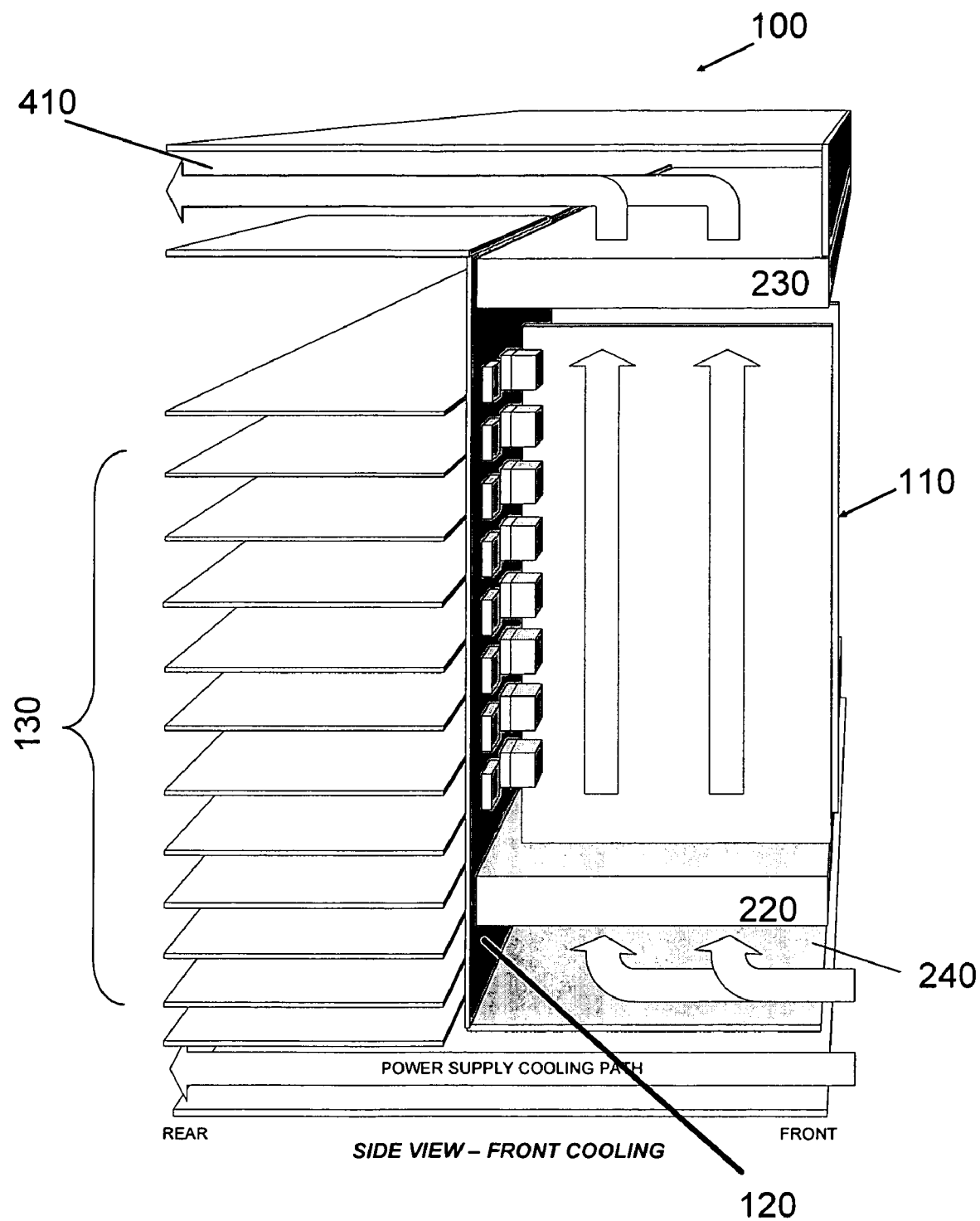
FIG. 4 is a side cutaway perspective view of the apparatus of FIG. 1.

FIG. 4 illustrates the air flow path across the vertical modules 110. As shown in FIG. 4, an upper plenum 410 is formed above the upper fan tray 230 and the horizontally oriented modules 130 to provide an air path to the exhaust outlets 320 illustrated in FIG. 3.

Figure 5:
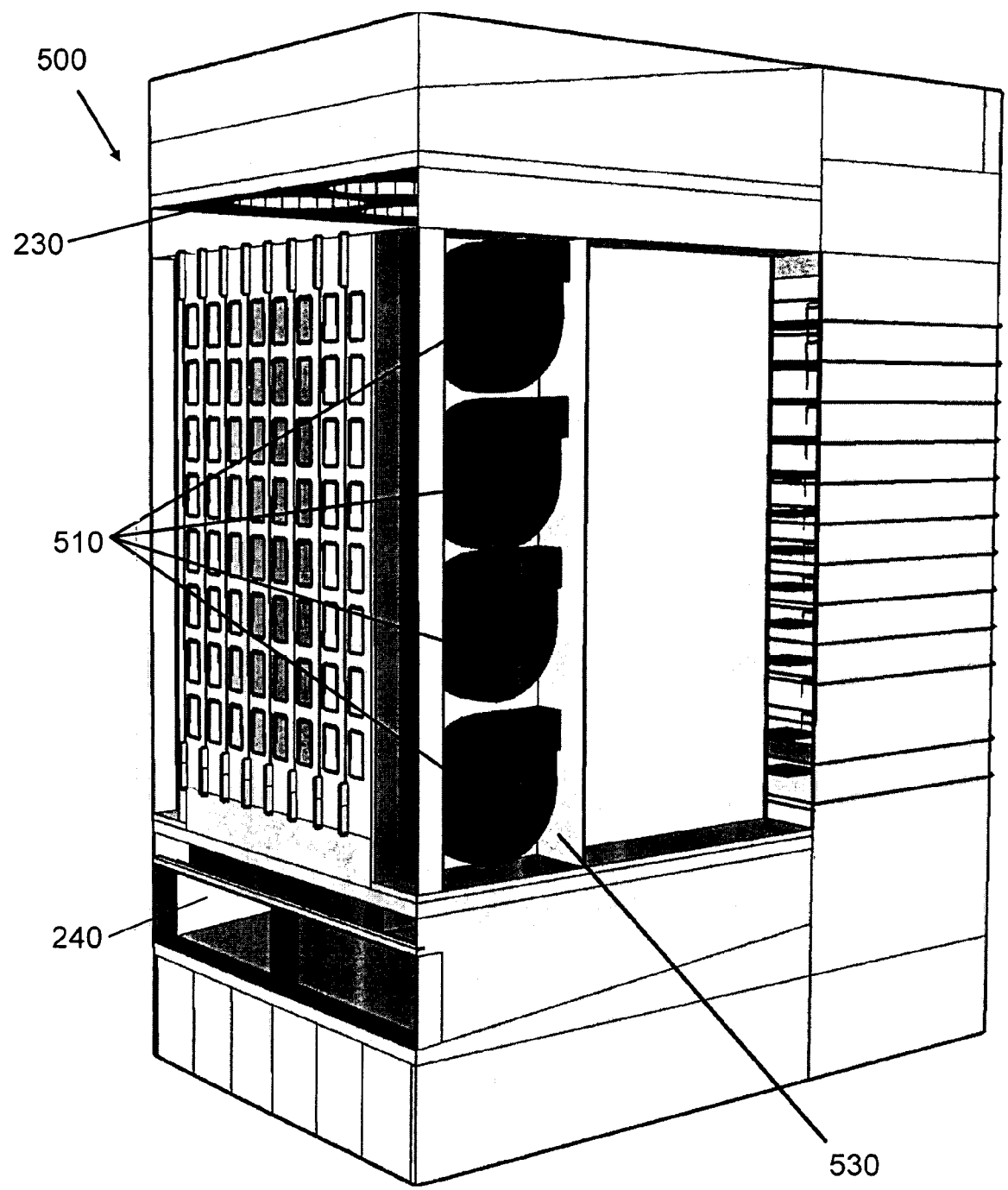
FIG. 5 is a perspective view illustrating another embodiment of an apparatus with orthogonal modules.
Figure 6:
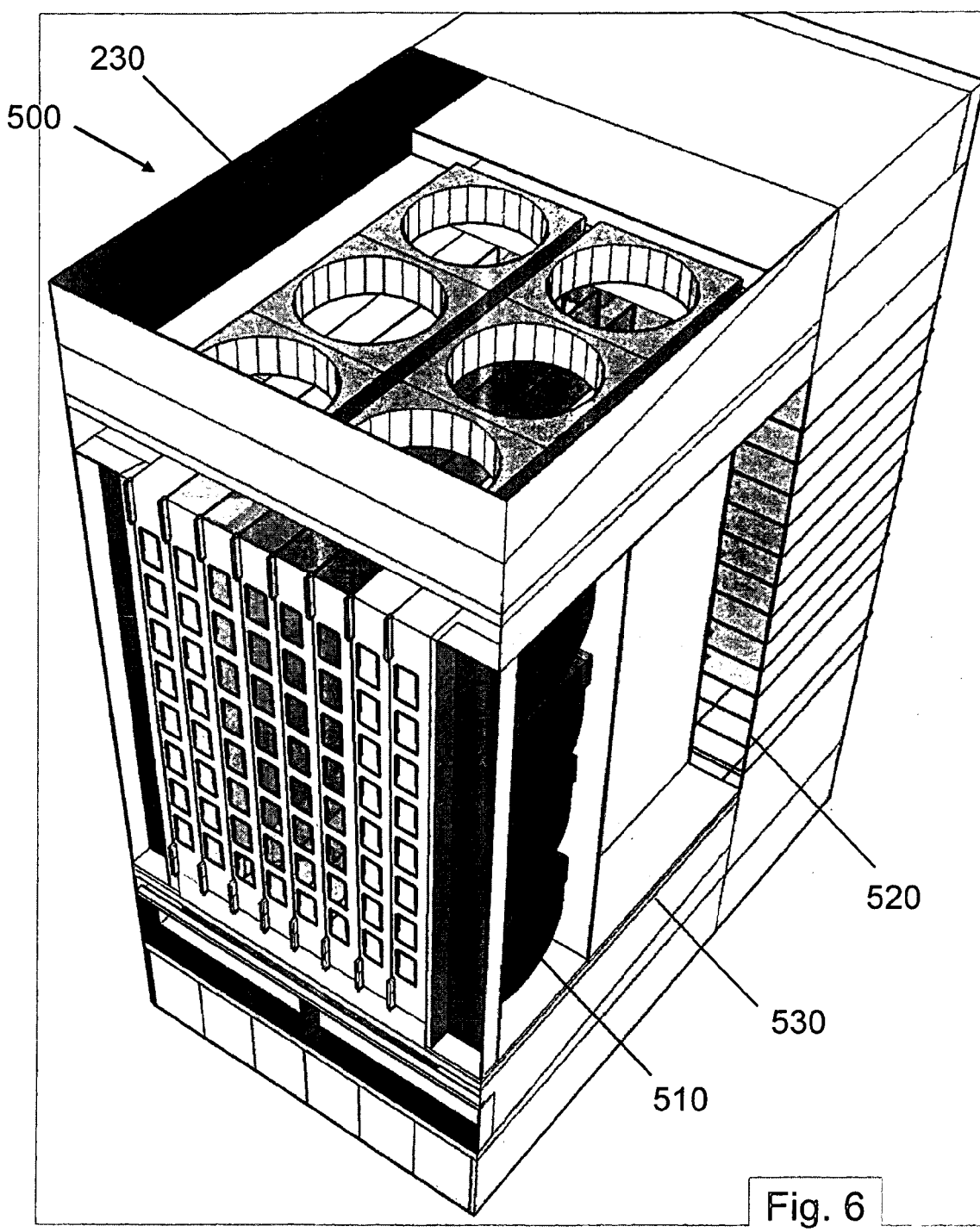
FIGS. 6-7 are additional perspective vies of the apparatus of FIG. 5.
Figure 7:
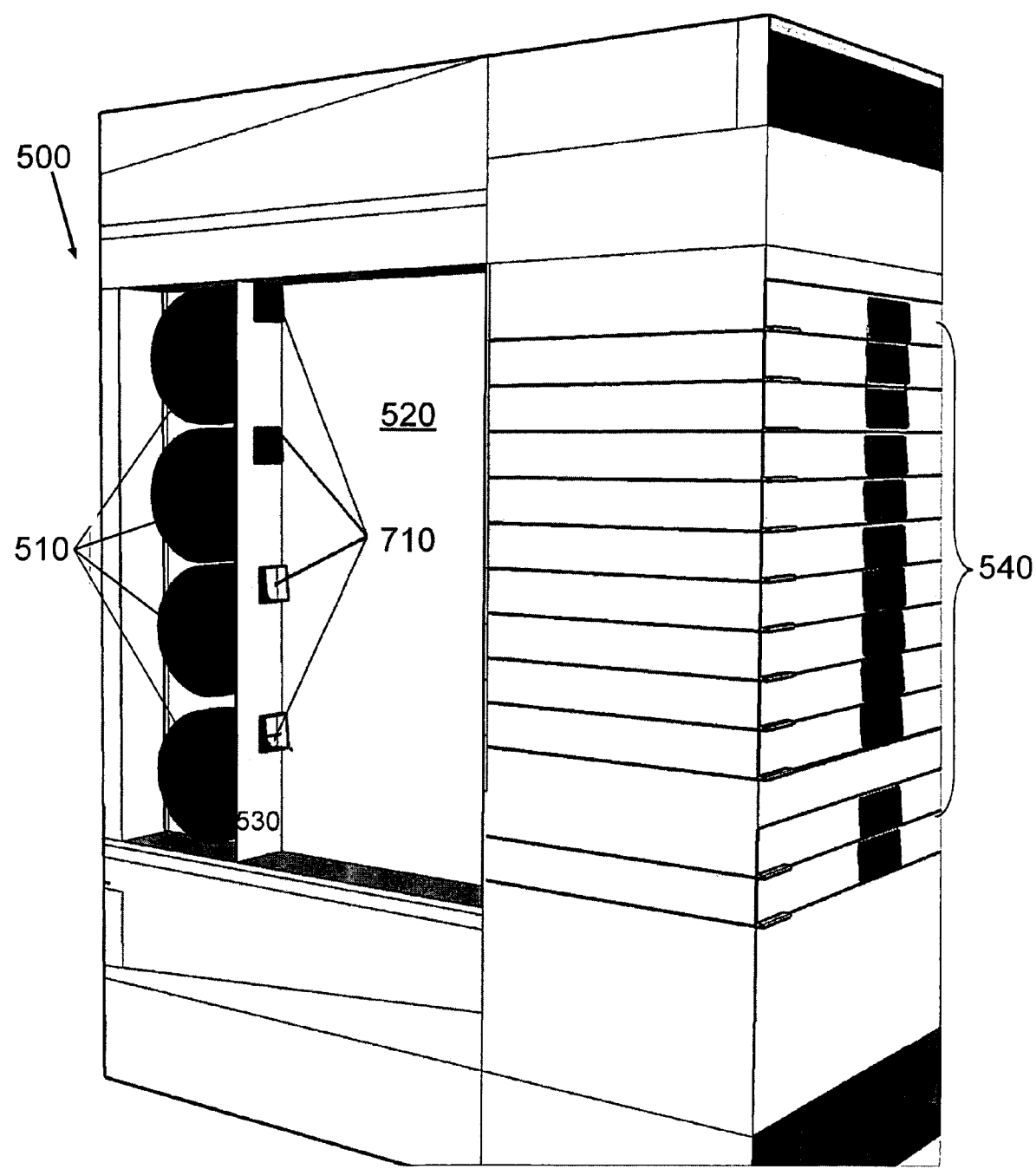

In another embodiment, instead of pulling air from the front of the apparatus 100 across the horizontal modules 130, as illustrated in FIG. 1, apparatus 500 pushes air across horizontal modules. One or more blowers or fans 510 are positioned toward the front of the apparatus 500 in a plenum 520. The fans 510 push air through the plenum 520 formed along the side of vertical modules, not shown in FIG. 5 for clarity of the drawing. Putting the fans 510 in the plenum 520 can allow for better filtering and cleaner air throughout the air path across the rear horizontally mounted modules than the negative pressure system illustrated in FIGS. 1-4. In some embodiments, filters can be placed at the inlets of the plenum 520 in front of the fans 510, but are not shown in FIG. 5 for clarity of the drawing. A barrier 530 is placed at the outlets of the fans 510. As best shown in FIG. 7, openings 710 are formed in the barrier 530 to better control air flow through the plenum 520. Air pushed through the plenum 520 is then pushed across the surfaces of the horizontal outlets 540 and exhausted through the rear of the apparatus 500. As shown in FIGS. 5 and 6, the apparatus 500 has a cooling system for the vertically oriented modules that is same as illustrated FIGS. 1-4. The only difference between the embodiments of FIGS. 1-4 and FIGS. 5-7 is that instead of pulling the air through the plenum and across the cards as in FIGS. 1-4, the apparatus 500 pushes the air from the front through the plenum 520 and across the cards 540. The numbered configuration and placement of fans shown in FIGS. 5-7 are exemplary and illustrative only and other numbers configuration and placement of fans can be used.

In apparatus 100, as illustrated in FIGS. 1-4 (and similarly in apparatus 500, illustrated in FIGS. 5-7), the vertically oriented modules 110 are in a front section of the apparatus 100 and horizontally mounted modules 130 are positioned in a rear section of the apparatus 100. In other embodiments, vertically oriented modules can be placed in the rear, and horizontally oriented modules can be placed in the front of the apparatus. FIGS. 8-11 illustrate such an apparatus according to one embodiment.

Figure 8:
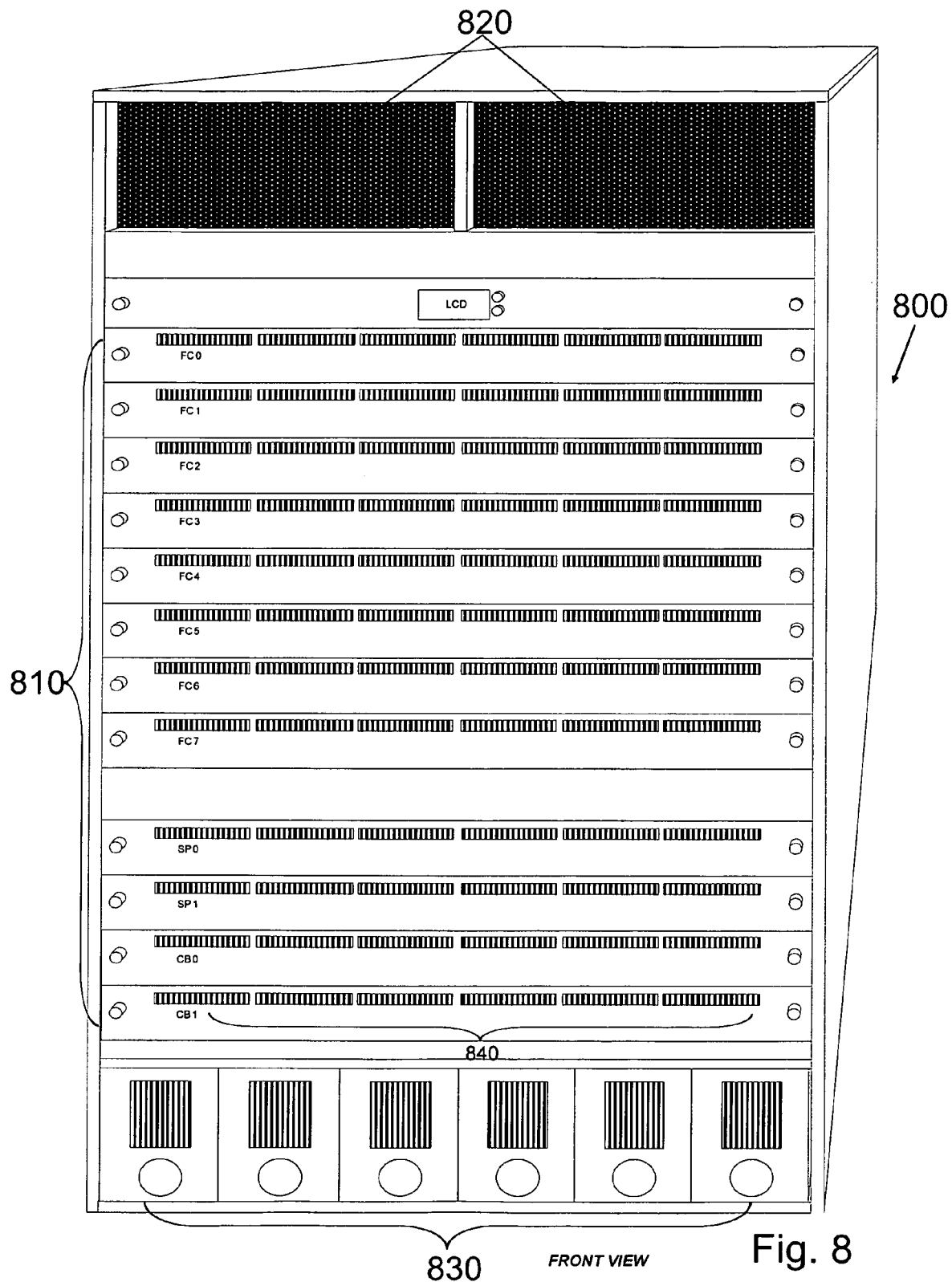
FIG. 8 is a front perspective view illustrating yet another embodiment of an apparatus with orthogonal modules.

Turning now to FIG. 8, a front perspective view illustrates an apparatus 800 that contains front mounted horizontal modules 810. As with apparatus 100, power supplies 830 are cooled from air flow from the front. Inlets 820 provide air to cool the rear mounted vertical modules of the apparatus 800. Openings 840 in each of the horizontal modules 810 provide an air path for cooling the horizontally mounted modules 810.

Figure 9:
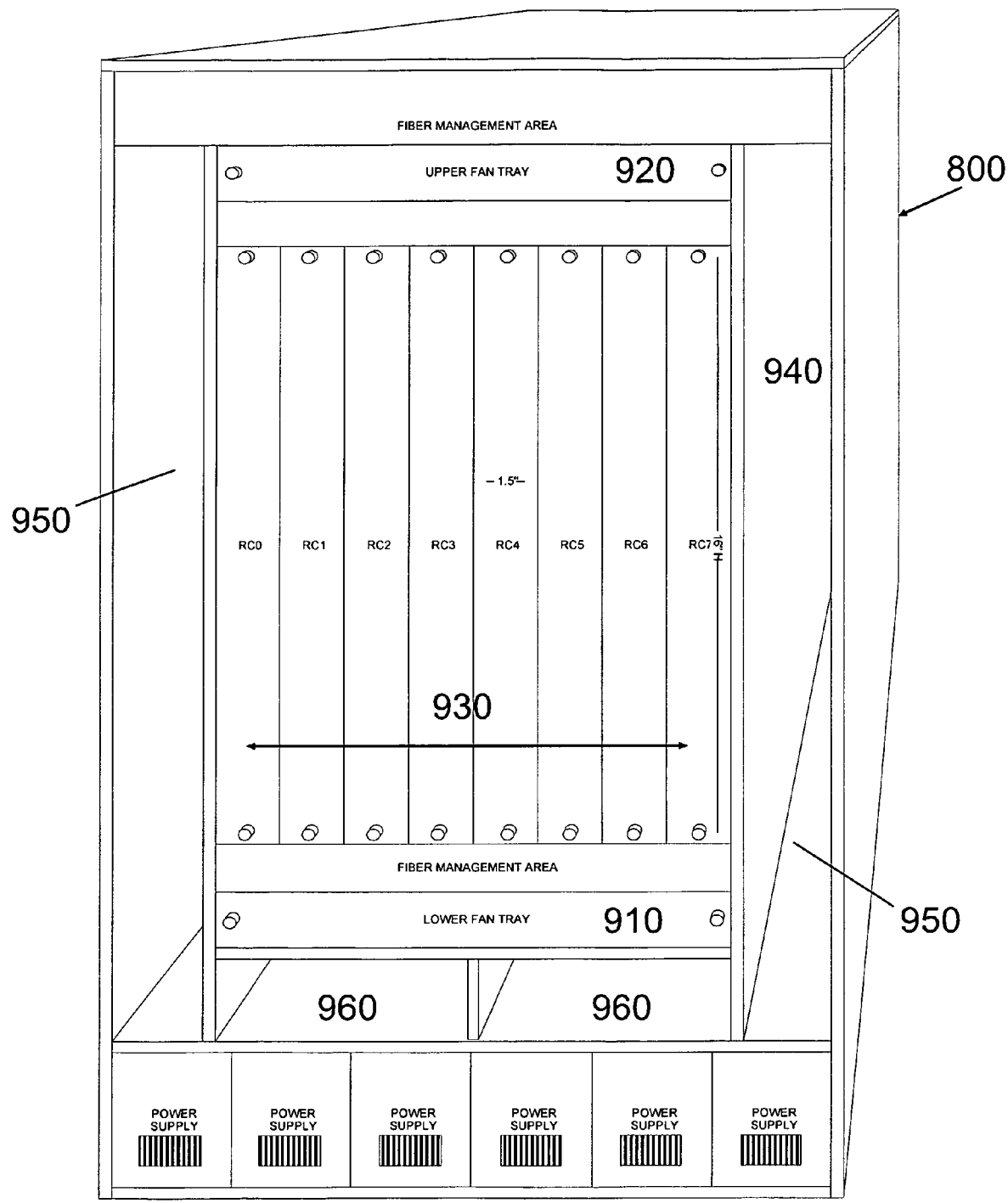
FIG. 9 is a rear perspective view of the apparatus of FIG. 8.

FIG. 9 is a rear perspective view of the apparatus 800 of FIG. 8. Vertically mounted modules 930 are cooled by an upper fan tray 920 pulling air from inlets 820 of FIG. 8, then pushing that air downward across the surfaces of the vertically mounted modules 930. A lower fan tray 910 contains exhaust fans that pull the heated air from the vertically oriented modules 930, exhausting the heated air through plenums 960 formed below the lower fan tray to the rear of apparatus 800. An end closure 940 holding the vertically oriented modules 930 forms a plenum 950 on either side of the vertically oriented modules 930 to exhaust heated air from the horizontally oriented modules 810.

Figure 10:
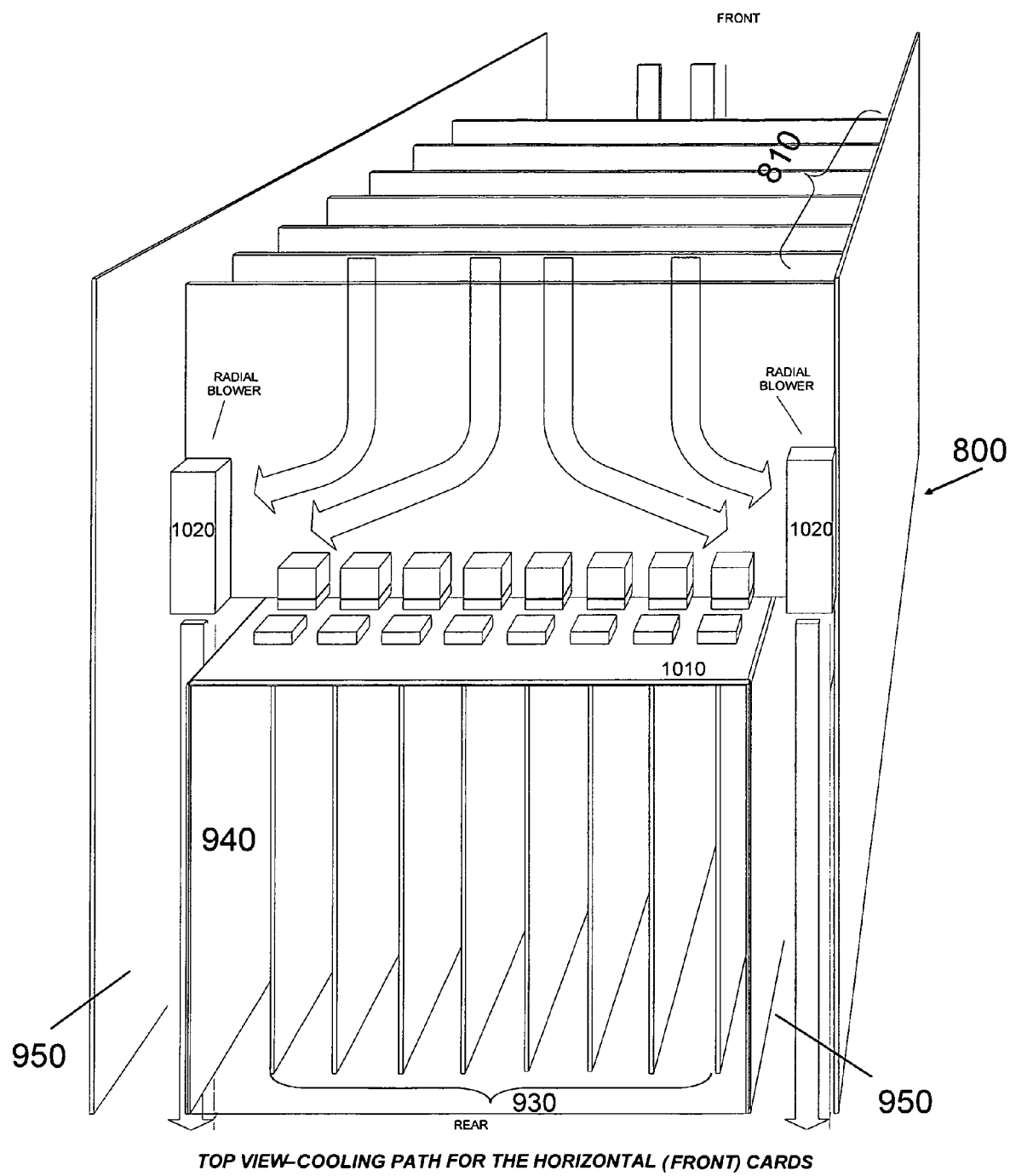
FIG. 10 is a top perspective view of the apparatus of FIG. 8.

Turning to FIG. 10, a top view shows the cooling path for the horizontal modules 810. Cool air is pulled in through the openings 840 shown in FIG. 8, and pulled across the surface of the modules 810 to a radial blower 1020 mounted on either side of each of the modules 810. The radial blowers 1020 then exhaust the heated air through the plenums 950 to the rear of the apparatus 800. As in the apparatus 100 of FIG. 1, a mid-plane 1010 connects the horizontally mounted modules 810 and the vertically mounted modules 930. Although described above as radial blowers, any desirable fan or blower can be used. The placement, configuration and number of blowers are exemplary and illustrative only, and other numbers configurations and placements can be used.

Figure 11:
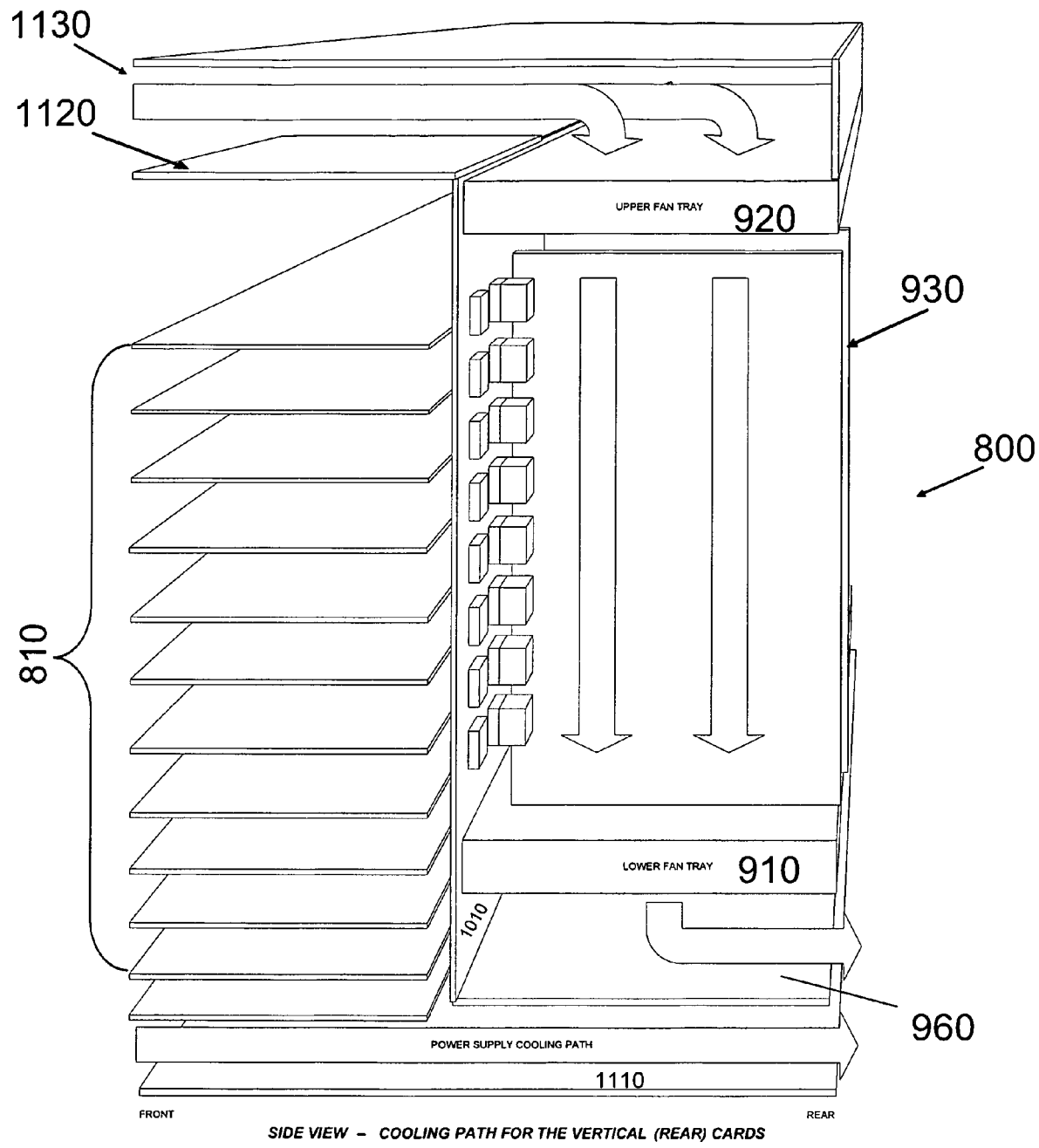
FIG. 11 is a side cutaway perspective of the apparatus of FIG. 8.

FIG. 11, a side view in perspective, shows the cooling path for the vertical rear modules 930 described above and the cooling path 1110 for power supplies at the bottom of the apparatus 800. A plenum 1130 provides air passage from the front of the apparatus 800 through inlets 820 to the upper fan tray 920 which then pushes air vertically downward across the surfaces of the modules 930, where the lower fan tray 910 exhausts the air through plenum 960 to the rear of the apparatus 800. A wall 1120 provides a portion of an enclosure above the horizontally mounted modules 810 to form the plenum 1130.

While certain exemplary embodiments have been described in details and shown in the accompanying drawings, it is to be understood that such embodiments are merely illustrative of and not devised without departing from the basic scope thereof, which is determined by the claims that follow. By way of example and not limitation, the specific electrical components utilized may be replaced by known equivalents or other arrangements of components which function similarly and provide substantially the same result.

What is claimed as new and desired to be protected by Letters Patent of the United States is:

1. A method of cooling an apparatus, comprising:
    cooling a first plurality of modules oriented in a first direction, comprising:
        pushing air from an edge of each of the first plurality of modules in the first direction; and
        pulling air from an opposite edge of each of the first plurality of modules in the first direction; and
    cooling a second plurality of modules oriented in a second direction, orthogonal to the first direction, comprising:
        moving air in the second direction across the second plurality of modules and through a plenum extending exterior to a first chamber containing the first plurality of modules;
    positioning an air-permeable barrier across a portion of each of the second plurality of modules, forming a side of a second chamber containing the second plurality of modules;
    generating a negative air pressure across the air-permeable barrier; and
    exhausting air from the apparatus.

2. A cooling system for an apparatus, comprising:
    a first chamber;
    a plenum formed exterior to the first chamber and fluidly isolated from the first chamber;
    a second chamber in fluid communication with the plenum;
    a cooling system for the first chamber, comprising:
    a first fan, configured to push air across the first chamber; and
    a second fan, configured to pull air from the first chamber; and
    a cooling system for the second chamber, comprising:
    a third fan, configured to move air between the plenum and the second chamber.

3. The system of claim 2, further comprising:
    a plurality of modules, disposed in the second chamber so that the air moved by the third fan traverses the plurality of modules,
    wherein the third fan is mounted on one of the plurality of modules.

4. The system of claim 2, wherein the third fan is configured to push air through the plenum into the second chamber.

5. The system of claim 4, further comprising:
    a partition formed in the plenum, between the third fan and the second chamber; and
    an opening formed in the partition and aligned with the third fan to allow the third fan to push air through the opening.

6. The system of claim 2, the second chamber comprising:
    an air-permeable barrier configured to create an air pressure difference between either side of the barrier, positioned between the plenum and the second chamber.

7. The system of claim 6, wherein the second chamber has a negative air pressure relative to the plenum.

* * * * *